(12) United States Patent
Lee

(10) Patent No.: US 7,928,798 B2
(45) Date of Patent: Apr. 19, 2011

(54) INTERNAL VOLTAGE GENERATION DEVICE

(75) Inventor: Jong Won Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/823,182

(22) Filed: Jun. 27, 2007

(65) Prior Publication Data

US 2008/0157856 A1    Jul. 3, 2008

(30) Foreign Application Priority Data

Dec. 29, 2006  (KR) .................. 10-2006-0138796

(51) Int. Cl.
*G05F 1/10* (2006.01)
*G05F 3/02* (2006.01)

(52) U.S. Cl. ....................................... 327/541

(58) Field of Classification Search .................. 327/538, 327/540, 541, 543
See application file for complete search history.

(56) References Cited

U.S. PATENT DOCUMENTS

| 6,452,854 B1 * | 9/2002 | Kato et al. ..................... 365/226 |
| 6,867,641 B2 | 3/2005 | Kang et al. |
| 6,922,098 B2 | 7/2005 | Choi et al. |
| 2005/0254333 A1 * | 11/2005 | Do ............................ 365/230.08 |
| 2006/0017494 A1 * | 1/2006 | Horiguchi et al. ............. 327/538 |
| 2006/0103452 A1 * | 5/2006 | Byeon et al. .................. 327/541 |

FOREIGN PATENT DOCUMENTS

| KR | 10-2000-0038583 A | 7/2000 |
| KR | 10-2005-0012002 A | 1/2005 |
| KR | 10-2006-0027058 A | 3/2006 |

* cited by examiner

*Primary Examiner* — Quan Tra

(74) *Attorney, Agent, or Firm* — John P. White; Cooper & Dunham LLP

(57) ABSTRACT

An internal voltage generation device is disclosed which includes an internal voltage generator operated in response to an enable signal, the internal voltage generator generating an internal voltage using a reference voltage, and a sub-voltage generator for driving an output terminal of the internal voltage generator to a predetermined voltage level in response to a control signal.

10 Claims, 4 Drawing Sheets

INTERNAL VOLTAGE GENERATION DEVICE

BACKGROUND

The present disclosure relates to a semiconductor memory device, and more particularly to an internal voltage generation device.

In general, a semiconductor memory device receives a supply voltage VDD, and generates and uses internal voltages required within a chip, including a core voltage Vcore and a high voltage VPP. The core voltage Vcore is used in a core area of the memory device, and is generated by down-converting the supply voltage VDD. The high voltage VPP is used to drive word lines of the memory device, and is generated by boosting the supply voltage VDD.

Meanwhile, an amount of refresh current consumption becomes an important issue in a dynamic random access memory (DRAM). A refresh operation of the DRAM includes an auto-refresh mode and a self-refresh mode. In each mode, word lines are refreshed in the order of internally controlled addresses at a certain period corresponding to a refresh retention time of each cell.

The self-refresh mode is an operation mode where the DRAM internally performs the refresh operation by itself for retention of information stored therein when a system including the DRAM carries out no operation for a certain period of time. For this reason, the DRAM consumes a large amount of current in the self-refresh mode.

One approach to reducing current consumption in the self-refresh mode which is called a multi-word line refresh technique, is to refresh cells connected to two or more word lines at the same time while the refresh operation is performed once and control a refresh period to twice or more of the refresh period of a conventional approach.

Application of the multi-word line refresh technique makes it possible to reduce the amount of current to be used in a refresh control circuit as compared with that when cells are refreshed one by one.

However, application of the multi-word line refresh technique to a DRAM is disadvantageous in that there is a shortage of driving capabilities of internal voltages used for refresh operation as DRAM capacity increases.

BRIEF SUMMARY

In an aspect of the present invention, an internal voltage generation device comprises an internal voltage generator operated in response to an enable signal, the internal voltage generator generating an internal voltage using a reference voltage, and a sub-voltage generator for driving an output terminal of the internal voltage generator to a predetermined voltage level in response to a control signal.

The control signal may drive the sub-voltage generator in a multi-word line self-refresh operation.

In another aspect of the present invention, an internal voltage generation device comprises an internal voltage generator operated in response to an enable signal, the internal voltage generator generating an internal voltage using a reference voltage a sub-voltage generator for driving an output terminal of the internal voltage generator to a predetermined voltage level in response to a control signal and a logic circuit for generating the control signal in response to a multi-word line enable signal and a drive signal in the internal voltage generator.

The control signal may drive the sub-voltage generator when a voltage level of the drive signal falls and the multi-word line enable signal is activated.

In yet another aspect of the present invention, an internal voltage generation device comprises a voltage pump for generating an internal voltage in response to an oscillation signal, and a sub-voltage pump for generating the internal voltage in response to the oscillation signal and a control signal and outputting the internal voltage to an output terminal of the voltage pump.

The control signal may drive the sub-voltage pump in a multi-word line self-refresh operation.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

An internal voltage generation device according to the present invention is configured to increase the driving capability of an internal voltage in a multi-word line self-refresh operation period so as to improve stability and reliability of a semiconductor memory device.

Figure 1:
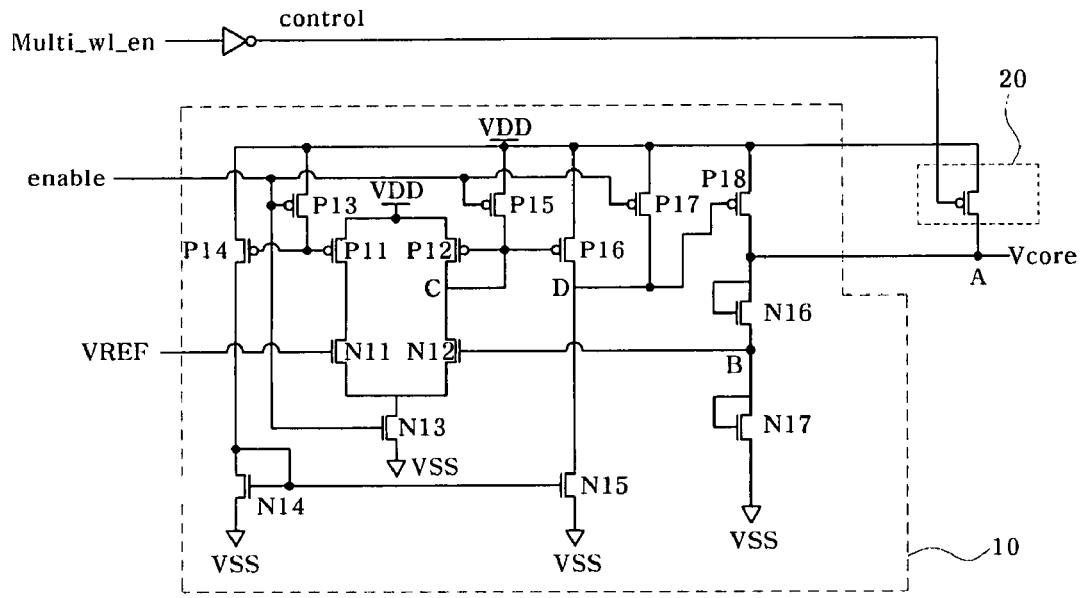
FIG. 1 is a circuit diagram showing the configuration of an internal voltage generation device according to an exemplary embodiment of the present invention.

FIG. 1 is a circuit diagram showing the configuration of an internal voltage generation device according to an exemplary embodiment of the present invention.

As shown in FIG. 1, the internal voltage generation device according to this embodiment comprises an internal voltage generator 10 operated in response to an enable signal Enable for generating a core voltage Vcore using a reference voltage VREF, and a sub-voltage generator 20 for driving an output terminal A of the internal voltage generator 10 to a supply voltage VDD level in response to a control signal Control. The control signal Control drives the sub-voltage generator 20 in a multi-word line self-refresh operation.

The internal voltage generator 10 includes a first pull-down device N11 connected between a first node and a second node and configured to pull the second node down in response to the reference voltage VREF, a second pull-down device N12 connected between the first node and a third node and configured to pull the third node down in response to a divided voltage of the internal voltage, or core voltage Vcore, a switch N13 connected between the first node and a ground voltage VSS terminal and configured to perform a switching operation in response to the enable signal Enable, a first pull-up device P11 connected between a supply voltage VDD terminal and the second node, a second pull-up device P12 connected between the supply voltage VDD terminal and the third node, a third pull-up device P16 for pulling a fourth node up in response to a signal at the third node, and a fourth pull-up device P18 for pulling the output terminal A up in response to a signal at the fourth node.

The internal voltage generator 10 further includes a voltage divider (N16 and N17) connected between the output terminal A and the ground voltage VSS terminal and configured to divide the internal voltage, or core voltage Vcore, and outputting the divided voltage.

Figure 2:
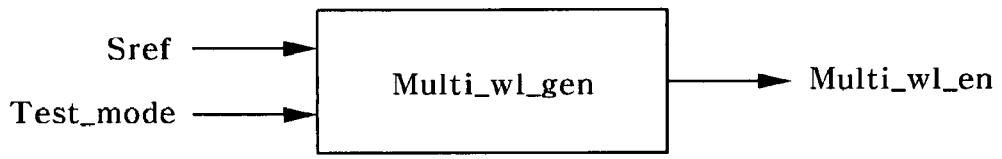
FIG. 2 is a block diagram of a multi-word line enable signal generator shown in FIG. 1.
Figure 3:
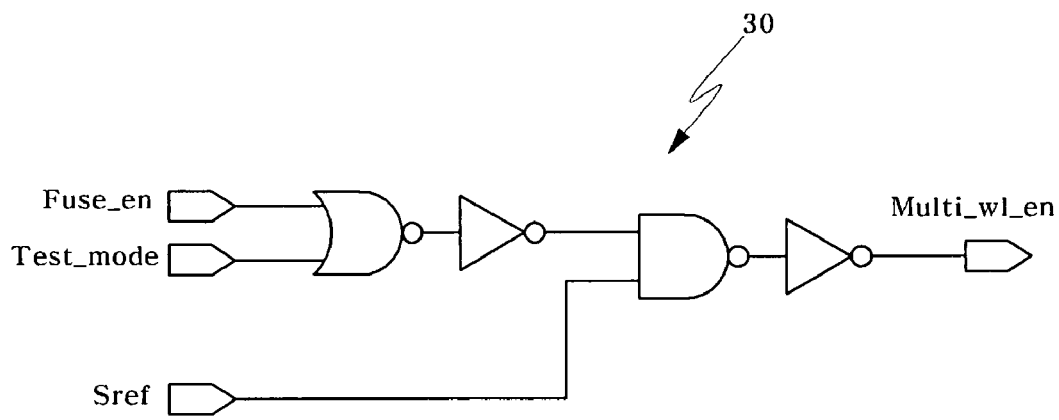
FIG. 3 is a detailed circuit diagram of the multi-word line enable signal generator of FIG. 2.

FIG. 2 is a block diagram of a multi-word line enable signal generator in FIG. 1, and FIG. 3 is a detailed circuit diagram of the multi-word line enable signal generator of FIG. 2. A multi-word line enable signal Multi_wl_en is made active in a self-refresh mode Sref to activate the control signal Control. That is, the control signal Control is activated in the multi-word line self-refresh operation to drive the sub-voltage generator 20 connected with the output terminal A of the internal voltage generator 10.

The operation of the internal voltage generation device with the above-stated configuration according to the present embodiment will hereinafter be described in detail with reference to FIGS. 1 to 3.

The internal voltage generation device according to the present embodiment acts to supply the core voltage Vcore as an internal voltage in the example of FIG. 1.

As shown in FIGS. 2 and 3, the multi-word line enable signal generator receives a self-refresh signal and a test mode signal, performs a logic operation with respect to the received signals, and generates the multi-word line enable signal Multi_wl_en as a result of the logic operation. The control signal in FIG. 1 is an inverted version of the multi-word line enable signal Multi_wl_en. Namely, the control signal makes a transition to a low level through an inverter when the multi-word line enable signal Multi_wl_en becomes active.

First, the internal voltage generator 10 generates an internal voltage and outputs the generated internal voltage to the output terminal A. In detail, when the enable signal Enable is enabled to a high level, the switch N13, which is an n-channel metal oxide semiconductor (NMOS) transistor, is turned on and p-channel metal oxide semiconductor (PMOS) transistors P13, P15 and P17 are turned off, thereby causing the internal voltage generator 10 to be enabled. As a result, the internal voltage generator 10 supplies an internal voltage of a predetermined level to the output terminal A through comparison between a voltage at a node B, which is a divided version of the voltage at the output terminal A, and the reference voltage VREF.

If the voltage at the output terminal A becomes lower than the predetermined level, the voltage at the node B, which is a divided version of the voltage at the output terminal A, becomes lower than the reference voltage VREF, so that the second pull-down device N12, which is an NMOS transistor, is turned on to a level lower than that of the first pull-down device N11, which is an NMOS transistor. Accordingly, the turn-on resistance of the NMOS transistor N12 becomes higher than that of the NMOS transistor N11.

As a result, a voltage at a node C rises, so that the turn-on resistance of the third pull-up device P16, which is a PMOS transistor, becomes higher, thereby causing a voltage at a node D to fall. Then, in response to the voltage at the node D, the turn-on resistance of the fourth pull-up device P18, which is a PMOS transistor, and the turn-on resistance of a PMOS transistor P19 are reduced, so that the voltage at the output terminal A rises. Consequently, the internal voltage rises.

Conversely, if the voltage at the output terminal A becomes higher than the predetermined level, the voltage at the node B, which is a divided version of the voltage at the output terminal A, becomes higher than the reference voltage VREF, so that the NMOS transistor N12 is turned on to a level higher than that of the NMOS transistor N11. Thus, the turn-on resistance of the NMOS transistor N12 becomes lower than that of the NMOS transistor N11. As a result, the voltage at the node C falls, so that the turn-on resistance of the PMOS transistor P16 becomes lower, thereby causing the voltage at the node D to rise. Then, in response to the voltage at the node D, the turn-on resistances of the PMOS transistor P18 and PMOS transistor P19 are increased, so that the voltage at the output terminal A falls. Consequently, the internal voltage falls.

In this manner, the internal voltage generator 10 can maintain the voltage at the output terminal A constant through the comparison operation as stated above, so as to supply the internal voltage, or core voltage Vcore, of the predetermined level through the output terminal A.

At this time, if the self-refresh mode is entered, the multi-word line enable signal Multi_wl_en is made active, so that a low signal is outputted through the inverter as the control signal Control. That is, in the multi-word line self-refresh operation, the control signal Control drives the sub-voltage generator 20 connected with the output terminal A of the internal voltage generator 10. In this manner, the internal voltage generation device according to the present embodiment can increase the driving capability of the driver in the multi-word line self-refresh operation period so as to reduce noise in the internal voltage.

Figure 4:
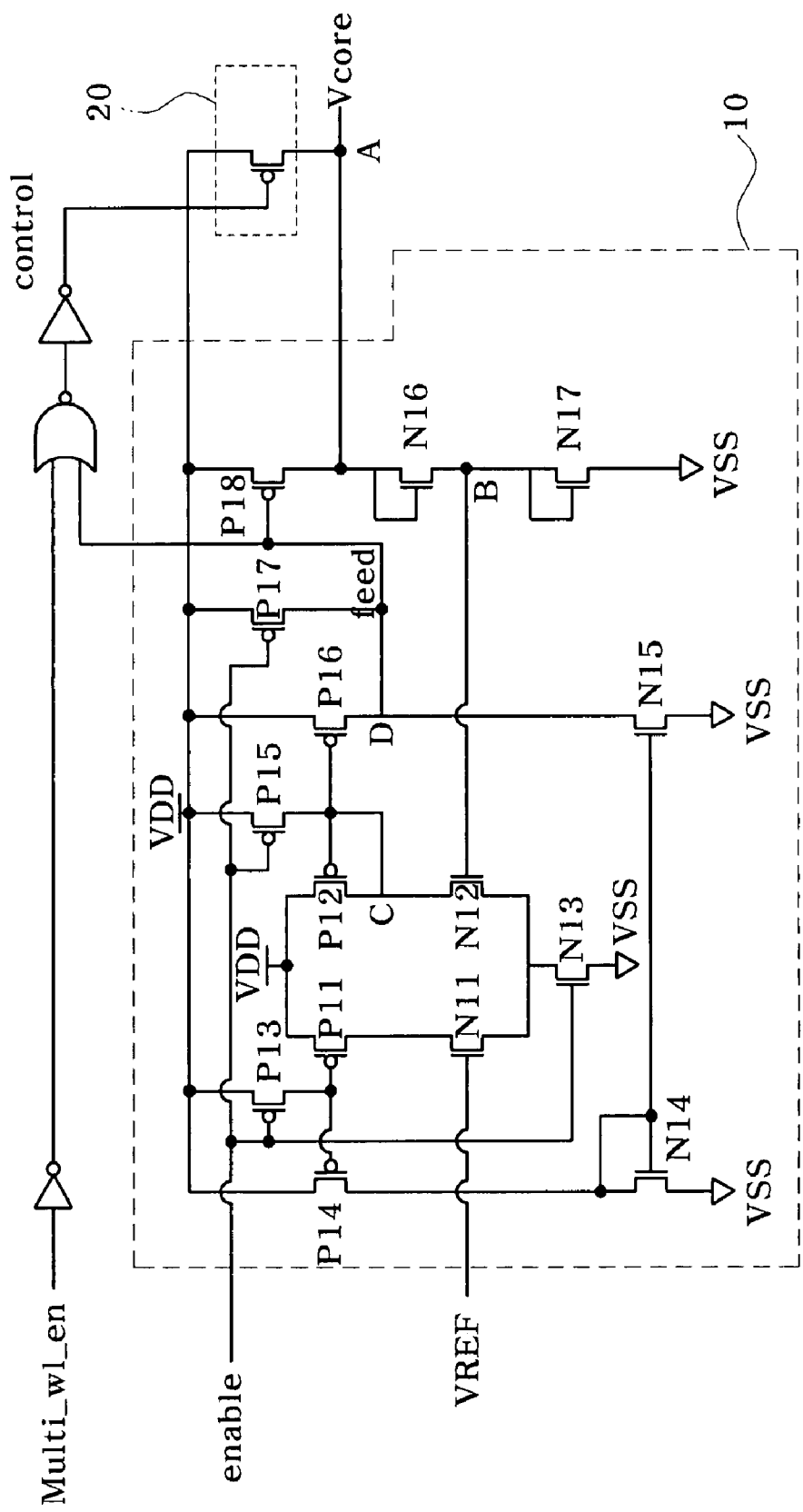
FIG. 4 is a circuit diagram showing the configuration of an internal voltage generation device according to another embodiment of the present invention.

FIG. 4 is a circuit diagram showing the configuration of an internal voltage generation device according to another embodiment of the present invention.

As shown in FIG. 4, the internal voltage generation device according to this embodiment comprises an internal voltage generator 10 operated in response to an enable signal Enable and configured to generate a core voltage Vcore using a reference voltage VREF, a sub-voltage generator 20 for driving an output terminal A of the internal voltage generator 10 to a level of a supply voltage VDD in response to a control signal Control, and a logic circuit for performing an OR operation with respect to a multi-word line enable signal Multi_wl_en and a signal Feed at a fourth node of the internal voltage generator 10 and generating the control signal Control as a result of the OR operation.

The control signal Control drives the sub-voltage generator 20 when a voltage level at the fourth node falls under the condition that the multi-word line enable signal Multi_wl_en is activated.

The operation of the internal voltage generator 10 in the internal voltage generation device with the above-stated configuration according to this embodiment is generally the same as that according to the first embodiment. However, in the internal voltage generation device according to the present embodiment, when a voltage at a node B, which is a divided version of the core voltage Vcore, becomes lower than the reference voltage VREF, an NMOS transistor N12 is turned on to a level lower than that of an NMOS transistor N11, so that the turn-on resistance of the NMOS transistor N12 becomes higher than that of the NMOS transistor N11. As a result, a voltage at a node C rises, so that the turn-on resistance of a PMOS transistor P16 becomes higher, thereby causing a voltage at a node D to fall. At this time, a low signal is outputted as the control signal Control in response to the voltage at the node D.

That is, when the voltage at the node B, which is a divided version of the core voltage Vcore, becomes lower than the reference voltage VREF in a multi-word line self-refresh operation, the control signal Control drives the sub-voltage generator 20 connected with the output terminal A of the internal voltage generator 10. In this manner, the internal voltage generation device according to the present embodiment can increase the driving capability of the driver in the multi-word line self-refresh operation period so as to reduce noise in the internal voltage.

Figure 5:
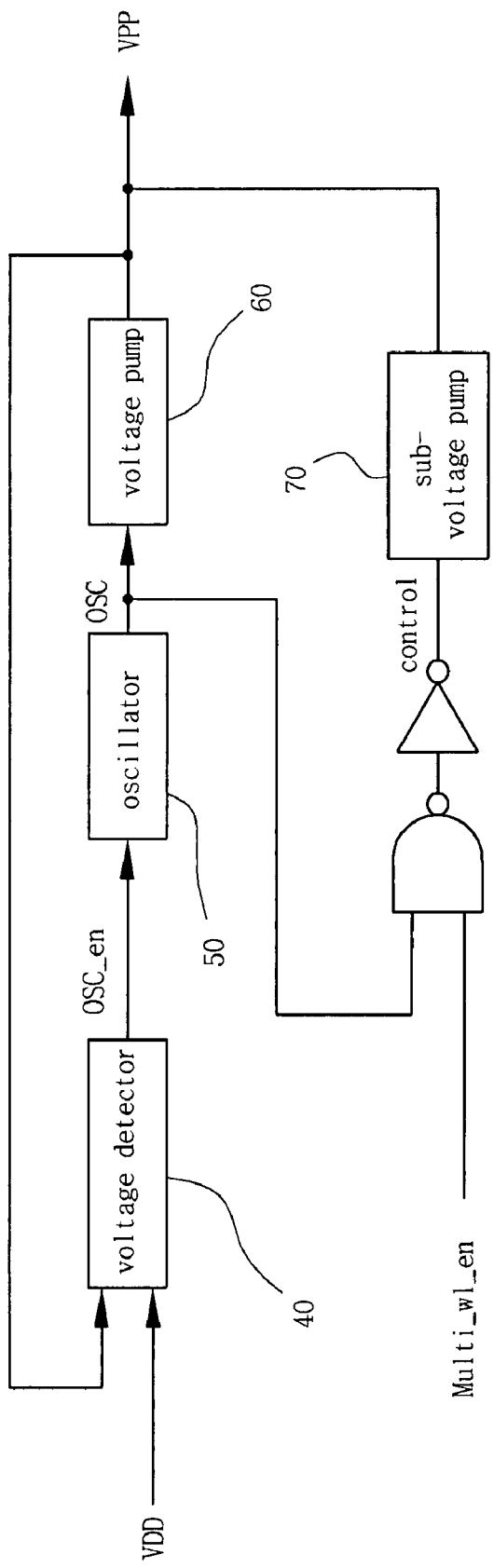
FIG. 5 is a block diagram showing the configuration of an internal voltage generation device according to another embodiment of the present invention.

FIG. 5 is a block diagram showing the configuration of an internal voltage generation device according to another embodiment of the present invention.

As shown in FIG. 5, the internal voltage generation device according to this embodiment comprises a voltage detector 40 for detecting a high voltage VPP fed back thereto and outputting a high voltage pumping enable signal OSC_EN when the detected high voltage VPP falls below a reference voltage, an oscillator 50 for outputting an oscillation signal OSC in response to the enable signal OSC_EN, a voltage pump 60 for generating the high voltage VPP in response to the oscillation signal OSC and feeding it back to the voltage detector 40, and a sub-voltage pump 70 for generating the high voltage VPP in response to the oscillation signal OSC and a control signal Control and outputting it to an output terminal of the voltage pump 60.

The control signal Control is activated in a multi-word line self-refresh operation to drive the sub-voltage pump 70 in the multi-word line self-refresh operation.

Figure 6:
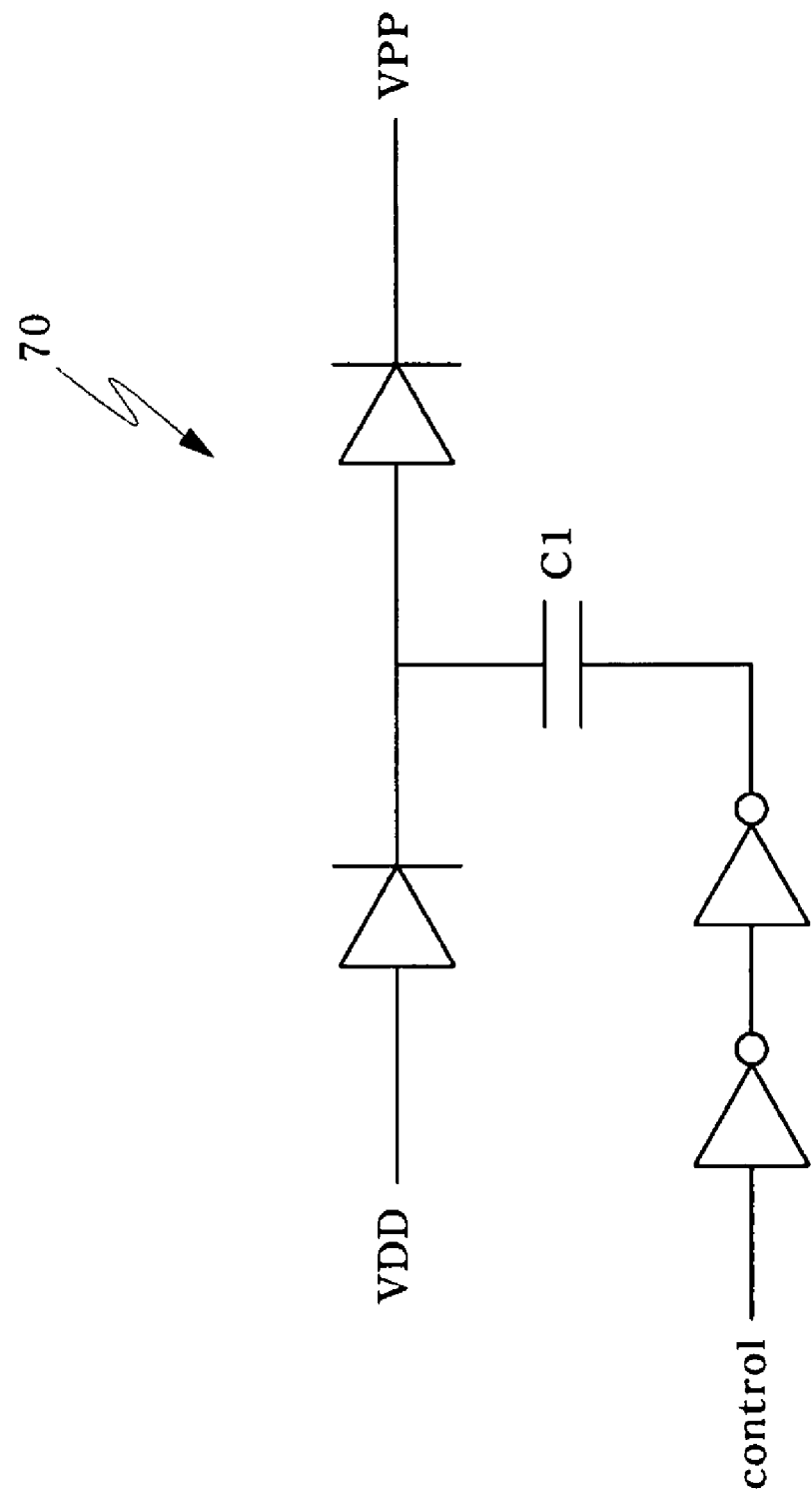
FIG. 6 is a circuit diagram of a sub-voltage pump shown in FIG. 5.

The sub-voltage pump 70 may include one or more sub-voltage pumps. FIG. 6 is a circuit diagram of the sub-voltage pump 70 in FIG. 5. The sub-voltage pump 70 acts to pump a high voltage of a predetermined level in response to the pump driving control signal Control which is activated in the multi-word line self-refresh operation.

The operation of the internal voltage generation device with the above-stated configuration according to the present embodiment will hereinafter be described with reference to FIGS. 5 and 6.

The internal voltage generation device according to the present embodiment acts to supply the high voltage VPP as an internal voltage in the example of FIG. 5.

If the voltage detector 40 detects a high voltage VPP fed back from the voltage pump 60 and generates a high voltage pumping enable signal OSC_EN as a result of the detection, the oscillator 50 generates an oscillation signal, or pulse signal, OSC in response to the high voltage pumping enable signal OSC_EN. Then, the voltage pump 60 pumps a high voltage VPP of a predetermined level in response to the pulse signal OSC.

At this time, if a self-refresh mode is entered, a multi-word line enable signal Multi_wl_en is made active, so that a high signal is outputted through an OR gate as the control signal Control. That is, the control signal Control drives the sub-voltage pump 70 in the multi-word line self-refresh operation. In this manner, the internal voltage generation device according to the present embodiment can increase the high voltage pumping capability in the multi-word line self-refresh operation period so as to reduce noise in the internal voltage.

Although preferred embodiments of the present invention have been disclosed for illustrative purposes, those skilled in the art will appreciate that various modifications, additions and substitutions are possible, without departing from the scope and spirit of the disclosure and the accompanying claims.

The present application claims priority to Korean patent application number 10-2006-138796, filed on Dec. 29, 2006, which is incorporated by reference in its entirety.

What is claimed is:

1. An internal voltage generation device comprising:
   an internal voltage generator being enabled in response to an enable signal, the internal voltage generator configured to generate an internal voltage using a reference voltage;
   a multi-word line enable signal generator configured to receive a self-refresh mode signal, which is activated when a semiconductor device including the internal voltage generation device enters a self-refresh mode in which operations are performed by the semiconductor device for retention of information stored therein, and a test mode signal, and generate a multi-word line enable signal, wherein the multi-word line enable signal is enabled when a self-refresh mode is entered in a state that the test mode signal is enabled; and
   a sub-voltage generator configured to drive an output terminal of the internal voltage generator to a predetermined voltage level when the multi-word line enable signal is enabled and a divided level of an internal voltage becomes lower than a reference voltage.

2. The internal voltage generation device according to claim 1, wherein a control signal drives the sub-voltage generator in a multi-word line self-refresh operation.

3. The internal voltage generation device according to claim 1, wherein the internal voltage is a core voltage which is used in a core area of a semiconductor memory device.

4. The internal voltage generation device according to claim 1, wherein the internal voltage generator comprises:
   a first pull-down device connected between a first node and a second node for pulling the second node down in response to the reference voltage;
   a second pull-down device connected between the first node and a third node for pulling the third node down in response to a divided voltage of the internal voltage;
   a switch connected between the first node and a ground voltage terminal for performing a switching operation in response to the enable signal;
   a first pull-up device connected between a supply voltage terminal and the second node;
   a second pull-up device connected between the supply voltage terminal and the third node;
   a third pull-up device for pulling a fourth node up in response to a first signal at the third node; and
   a fourth pull-up device for pulling the output terminal up in response to a second signal at the fourth node.

5. The internal voltage generation device according to claim 4, wherein the internal voltage generator further comprises a voltage divider connected between the output terminal and the ground voltage terminal for dividing the internal voltage and outputting the divided voltage.

6. An internal voltage generation device comprising:
   an internal voltage generator being enabled in response to a first enable signal, the internal voltage generator configured to generate an internal voltage using a reference voltage;
   a multi-word line enable signal generator configured to receive a self-refresh mode signal, which is activated when a semiconductor device including the internal voltage generation device enters a self-refresh mode in which operations are performed by the semiconductor device for retention of information stored therein and a test mode signal, and generate a multi-word line enable signal, wherein the multi-word line enable signal is enabled when the self-refresh mode is entered in a state that the test mode signal is enabled;

a logic circuit configured to generate a control signal in response to the multi-word line enable signal and a drive signal in the internal voltage generator; and a sub-voltage generator configured to drive an output terminal of the internal voltage generator to a predetermined voltage level when the control signal is enabled and a divided level of an internal voltage becomes lower than a reference voltage.

7. The internal voltage generation device according to claim 6, wherein the control signal drives the sub-voltage generator when a voltage level of the drive signal falls and the multi-word line enable signal is activated.

8. The internal voltage generation device according to claim 6, wherein the internal voltage is a core voltage which is used in a core area of a semiconductor memory device.

9. The internal voltage generator device according to claim 6, wherein the internal voltage generator comprises:

a first pull-down device connected between a first node and a second node for pulling the second node down in response to the reference voltage;

a second pull-down device connected between the first node and a third node for pulling the third node down in response to a divided voltage of the internal voltage;

a switch connected between the first node and a ground voltage terminal for performing a switching operation in response to the first enable signal;

a first pull-up device connected between a supply voltage terminal and the second node;

a second pull-up device connected between the supply voltage terminal and the third node;

a third pull-up device for pulling a fourth node up in response to a first signal at the third node; and a fourth pull-up device for pulling the output terminal up in response to a second signal at the fourth node.

10. The internal voltage generation device according to claim 9, wherein the internal voltage generator further comprises a voltage divider connected between the output terminal and the ground voltage terminal for dividing the internal voltage and outputting the divided voltage.

* * * * *